(12) United States Patent
Park et al.

(10) Patent No.: US 6,770,403 B2
(45) Date of Patent: Aug. 3, 2004

(54) MASK FOR A PHOTOLITHOGRAPHY PROCESS AND METHOD OF FABRICATING THE SAME

(75) Inventors: Ji-Soong Park, Yongin-si (KR); Sang-Uhk Rhie, Anyang-si (KR)

(73) Assignee: Samsung Electronics Co., Ltd., Suwon (KR)

(*) Notice: Subject to any disclaimer, the term of this patent is extended or adjusted under 35 U.S.C. 154(b) by 170 days.

(21) Appl. No.: 10/100,031

(22) Filed: Mar. 19, 2002

(65) Prior Publication Data
US 2002/0142597 A1 Oct. 3, 2002

(30) Foreign Application Priority Data

Mar. 30, 2001 (KR) .................................. 2001-16961

(51) Int. Cl.[7] .......................... G03F 9/00; G03F 17/50
(52) U.S. Cl. ............................................. 430/5; 716/19
(58) Field of Search ........................... 430/5, 322, 396, 430/22, 30; 378/34, 35; 716/19

(56) References Cited

U.S. PATENT DOCUMENTS 6,326,106 B1 * 12/2001 Kitagawa ....................... 430/5

* cited by examiner

Primary Examiner—Mark F. Huff
Assistant Examiner—Saleha Mohamedulla

(57) ABSTRACT

A mask, and a method for fabricating the mask, for optically transcribing a pattern corresponding to integrated circuits on a semiconductor substrate by using an exposure device. The mask has a plurality of features corresponding to circuit elements with at least one recessed corner defined by two edges. The mask includes a plurality of proximity correcting auxiliary features, each having two extension parts which extend in parallel along and spaced away from each of two edges defining a recessed corner. The extension parts are bent at a same angle corresponding to the recessed corner, to be connected to each other. The proximity correcting auxiliary features have polygonal shapes having predetermined widths. Since polygonal auxiliary features are provided corresponding to the recessed corner, auxiliary features are symmetrically maintained, reducing a number of auxiliary features. The amount of data representing the whole mask pattern can thus be reduced.

13 Claims, 9 Drawing Sheets

MASK FOR A PHOTOLITHOGRAPHY PROCESS AND METHOD OF FABRICATING THE SAME

The present application claims priority under 35 U.S.C. §119 to Korean Application No. 2001-16961 filed on Mar. 30, 2001, which is hereby incorporated by reference in its entirety for all purposes.

BACKGROUND OF THE INVENTION

1. Field of the Invention

The present invention relates to a mask for a photolithography process and a method of fabricating the same, and more particularly to a mask for a photolithography process and a method for improving an auxiliary feature, such as an assisted bar, a scattering bar or an intensity leveling bar, which is formed at peripheries of isolated edges of features corresponding to each circuit element of an integrated circuit, so as to correct the optical proximity effect (OPE).

2. Description of the Related Art

As the design rule of devices and connecting wires integrated in a semiconductor chip is reduced, conventional lithography techniques using an ultraviolet ray do not prevent the distortion of a pattern formed on a wafer. That is, even though an I-line and a DUV (deep ultraviolet) ray have wavelengths of 248 nm, a minimum design rule thereof is 100 nm, such that distortion of the pattern is caused by diffraction and interruption of light during a semiconductor device manufacturing process. The distortion of the pattern becomes more serious as the minimum design rule is reduced. Accordingly, it is required to compensate for distortion of the pattern occurring during a photolithography process because of a limit-resolution.

In a photolithography process, a pattern of a photo mask is copied on a wafer through an optical lens. Since an optical system for projecting an image acts as a low-band filter, the image formed on the wafer is distorted as compared with an original shape. For instance, when a rectangular-shaped mask is used, a circular pattern is formed on the wafer since the light having high-frequency, that is, the light corresponding to edges of the rectangular-shaped mask, is not transmitted. When the mask pattern has a large size, a basic spatial frequency is lowered, so that light having relatively high frequency can be transmitted through the mask, whereby an image substantially identical to the original image can be formed on the wafer. However, when the pattern has a small size, the spatial frequency becomes high, so that the transmission rate of light is reduced, whereby serious distortion results.

Various types of lithography equipment have been developed to reduce distortion, but distortion still remains a problem. For this reason, there has been an attempt to change the design of the mask to compensate for the distortion of the pattern. For example, optical proximity correction (OPC) has been considered. According to optical proximity correction, the shape of the mask is pre-deformed considering the distortion of the pattern, so as to form a required image on the wafer.

Optical proximity correction can be achieved when adjacent features are interacted with each other in such a manner that a pattern-dependent alteration can be created. That is, lines, which are designed to have the same dimension and which are arranged in a layout such that they have different proximity with respect to other features, have different dimension from each other after the developing process has been finished. Accordingly, densely arranged lines are differently transcribed as compared with spaced lines. If line dimension is not constantly reproduced, serious problems occur in the integrated chip (IC).

U.S. Pat. No. 5,242,770 discloses a mask including additional lines referred to as scattering bars, assisted bars or intensity leveling bars for performing the function of adjusting an edge intensity gradient of an isolated edge in a mask pattern. The gradient of the isolated edge is adjusted such that the gradient of the isolated edge matches the edge intensity gradient of a densely packed edge, by means of the additional lines. As a result, the isolated feature is identically transcribed with respect to the densely packed feature, so that the optical proximity effect is greatly reduced.

U.S. Pat. No. 5,663,893 discloses a method for adding sub-lithographic correction features to all features in an original mask pattern. The original mask pattern is segmented and the correction features are formed in each segment. As a result, computer processings are carried out in a time and memory efficient manner.

U.S. Pat. No. 5,821,014 discloses a design rule of a scattering bar between features which are spaced by a predetermined intermediate distance as compared with isolated features and densely packed features. Accordingly, the proximity correction is possible with respect to the densely packed features.

U.S. Pat. No. 6,120,952 discloses a method for reducing the proximity effect by adjusting a dimension of a main feature with respect to a proximity correction feature, after defining a space between the main feature and the proximity correction feature. By adjusting the dimension of the main feature, an optimum feature dimension can be transcribed.

As mentioned above, techniques for correcting the proximity effect using auxiliary features in the form of bars are variously developed and used in the field. However, the design rule of the conventional bar-type auxiliary features has the following limitations: 1) isolated edges, in which features are spaced by a predetermined distance, have to be used; 2) auxiliary features have to be spaced by a predetermined distance from the isolated edges; and 3) auxiliary features have to be spaced by a predetermined distance from each other.

Accordingly, in view of the above noted limitations, the created auxiliary features can be adapted for simple patterns, such as rectangular pattern. However, when the auxiliary features are used for complex patterns, such as an oblique line pattern, a U-shaped pattern, an L-shaped pattern, a T-shaped pattern, and a cross line pattern, the auxiliary features are asymmetrically created, or relatively short auxiliary features are removed by periphery auxiliary features having relatively long lengths.

In addition, when the shape of patterns are complicated, the created patterns cannot be matched with the design rule. In extreme cases, the singularity inspection by means of a design rule checking (DRC) is impossible.

Also, as auxiliary features are added to an area in which a distance between patterns are small, a distance between adjacent patterns is smaller so that a pattern bridge or a kissing effect is generated, thereby lowering the resolution of the mask. In addition, since the auxiliary features are created as a bar shape with respect to each isolated edge, the number of auxiliary features is increased, so that data of the whole mask pattern is increased. The data of the bar-type auxiliary features are represented as 32 bit data in case of GDS (Graphic Data System) II format, so that data treating time is increased if the data of the whole data set is increased. Also, it is difficult to inspect the mask and a great amount of memory capacitances are required.

Recently, a memory article such as a DRAM requires an integration degree above a GIGA level. Therefore, in order to integrate a great amount of memory cells in a limited area, a cell layout has a complex structure including a bending section instead of a straight section. In the case of a gate electrode pattern, an L-shaped cell layout is adopted so as to increase the current driving capacitance in a narrow area.

In the above gate electrode pattern, the entire length of a gate has to be uniformly formed in an active area. If the length of the gate is short, a critical value of the threshold voltage is extremely lowered by a short channel effect of a MOS FET, so that the cell malfunctions. In contrast, if the length of the gate is long, the current driving capacitance is reduced so that a critical operating speed is lowered.

In addition, in order to allow the MOS FETs to have the same features over the entire area of the chip, the length of the gates have to be uniformly maintained over the entire area of the chip. Accordingly, it is required to solve and improve the problem of the conventional auxiliary feature-creating algorithm.

SUMMARY OF THE INVENTION

The present invention is therefore directed to a mask, and a method of fabricating a mask, which substantially overcome one or more of the problems due to the limitations and disadvantages of the related art.

The present invention has been made to solve the above problems of the related art, and therefore has as an object to provide a mask capable of reducing the amount of data required by reducing the number of auxiliary features, wherein the auxiliary features corresponding to recessed corners are formed in a polygonal shape while maintaining the symmetry of the auxiliary features. Another object of the present invention is to provide a method for fabricating such a mask.

To achieve these and other objects of the present invention, there is provided a mask for optically transcribing a pattern corresponding to integrated circuits onto a semiconductor substrate, by using an exposure device. The mask has a plurality of features corresponding to circuit elements for forming the integrated circuits, and includes at least one recessed corner defined by two edges.

In addition, the mask has a plurality of polygonal proximity correcting auxiliary features including two extension parts which extend in parallel along each of two edges defining the recessed corner and that are spaced apart from the two edges by a predetermined distance. The two extension parts are bent at a same angle corresponding to the recessed corner, so as to be connected to each other. The proximity correcting auxiliary features have polygonal shapes with predetermined widths.

To also achieve the objects of the present invention, there is provided a method of fabricating a mask for optically transcribing a pattern corresponding to integrated circuits onto a semiconductor substrate, by using an exposure device. The method includes fabricating a plurality of features corresponding to circuit elements for forming integrated circuits onto the mask and including at least one recessed corner defined by two edges; and fabricating a plurality of polygonal proximity correcting auxiliary features having predetermined widths onto the mask, including two extension parts which extend in parallel along each of two edges defining the recessed corner and that are spaced apart from the two edges by a predetermined distance. The two extension parts are bent at a same angle corresponding to the recessed corner, so as to be connected to each other.

According to another embodiment of the present invention, there is provided a method of fabricating a mask for optically transcribing a pattern corresponding to integrated circuits onto a semiconductor substrate, by using an exposure device. The method includes creating data sets of a plurality of features on the mask, the features corresponding to circuit elements for forming the integrated circuits; selecting first data sets of isolated edges from the data sets of the plurality of features; creating second data sets of bar-type auxiliary features in view of the selected first data sets of the isolated edges, the bar-type auxiliary features having predetermined widths and extending in parallel along isolated edges spaced from each isolated edge by a predetermined distance; creating third data sets of the bar-type auxiliary features corresponding to the recessed corner in view of the first data sets of isolated edges and the second data sets of bar-type auxiliary features; creating fourth data sets of polygonal auxiliary features by removing extension parts of the bar-type auxiliary features, which extend within the predetermined distance from the isolated edges, in view of the second data sets of bar-type auxiliary features corresponding to the recessed corner; creating final auxiliary feature data sets by replacing the third data set of the bar-type auxiliary features corresponding to the recessed corner among the second data sets of the bar-type auxiliary features with the fourth data sets of the polygonal auxiliary features; and creating mask pattern data sets by combining the data sets of the features and the final auxiliary feature data sets.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Hereinafter, a preferred embodiment of the present invention will be described in detail with reference to accompanying drawings. In the present invention, instead of bar-type auxiliary features, polygonal auxiliary features are used for isolated edges of features having recessed corners. It is also to be understood that the following embodiments should not limit the scope of the present invention. Also, in order to clearly explain the present invention, the lithography process will not be described in detail.

In the lithography process, the proximity effect means that features having the same dimension are transcribed on a mask with different dimension, according to the proximity with respect to other features. That is, the proximity effect is generated by the diffraction phenomenon generated between adjacent feature edges. Therefore, in order to prevent the non-uniform transcription of patterns caused by the proximity effect, bar-type auxiliary features, which cannot be developed on a photoresist, are formed in the vicinity of isolated edges. As a result, features having the isolated edges and features having densely packed edges are transcribed with the same dimension as the original dimensions thereof. Examples of such techniques are disclosed in the above noted U.S. Pat. Nos. 5,242,770; 5,663,893; 5,821,014; and 6,120,952.

According to U.S. Pat. No. 5,821,014, an edge of a feature is referred to as an isolated edge when a distance between adjacent features is more than 7 w (wherein w is a width of a bar-type auxiliary feature). In addition, a bar-type auxiliary feature having a width (w) is formed spaced apart from each of two isolated edges by 3 w. The space between the adjacent auxiliary features is at least 2 w.

Figure 1A:
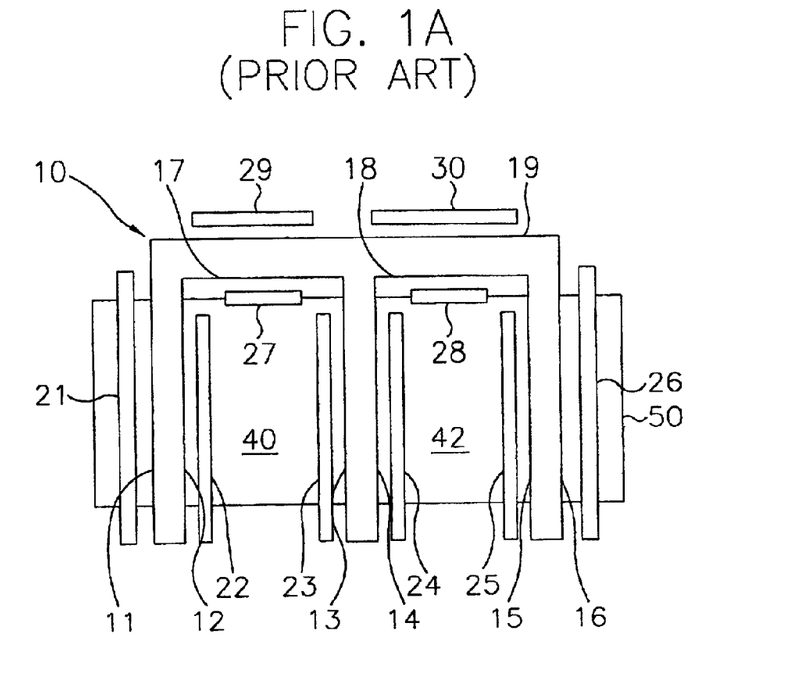
FIGS. 1A to 1C are views showing a method of creating bar-type auxiliary features for correcting the proximity effect.

As shown in FIG. 1A, bar-type auxiliary features 21 to 30 are created with respect to isolated edges 11 to 19 of an m-shaped feature 10. Auxiliary features 22, 23, and 27 formed in an area 40 surrounded by isolated edges 12, 13 and 17, and auxiliary features 24, 25 and 28 formed in an area 42 surrounded by isolated edges 14, 15 and 18, are spatially adjacent to each other.

Figure 1B:
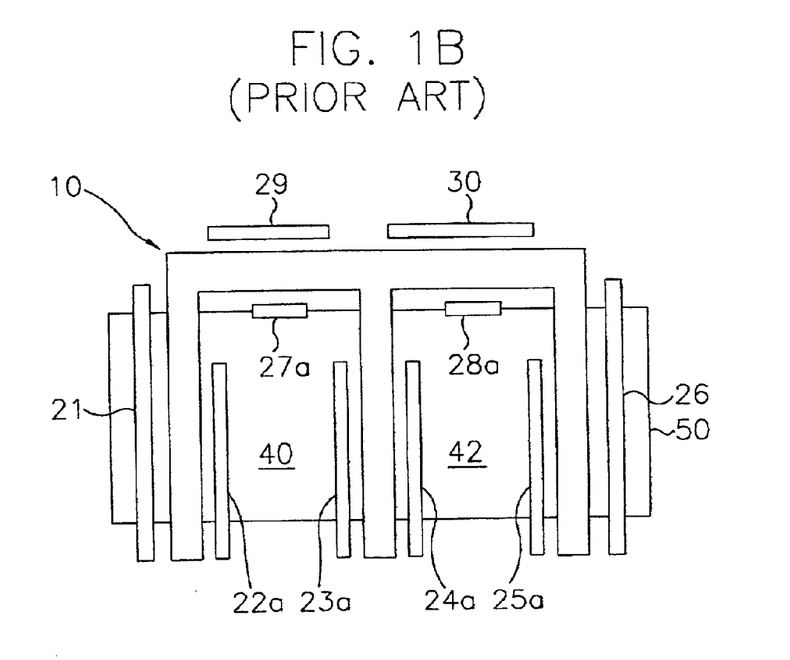

Accordingly, as shown in FIG. 1B, the lengths of the auxiliary features, which are spatially adjacent to each other, have to be adjusted such that the minimum distance (2 w) is maintained therebetween, thereby creating auxiliary features 22a, 23a, 27a, 24a, 25a and 28a.

Figure 1C:
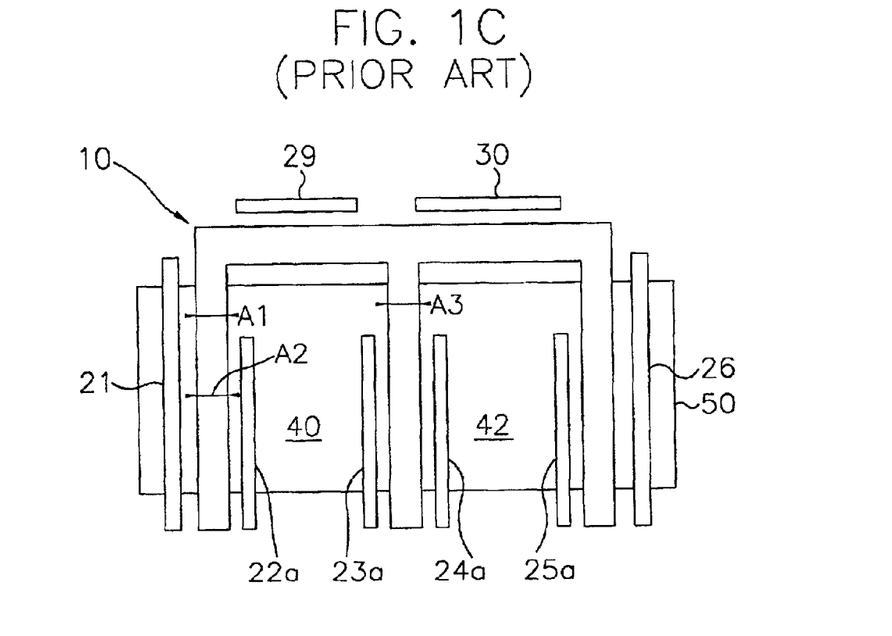

Then, a filtering process is carried out. As shown in FIG. 1C, if the lengths of auxiliary features 27a and 28a are reduced below a standard size, the auxiliary features 27a and 28a are removed during the filtering process.

Therefore, as shown in FIG. 1C, pairs of auxiliary features 21 and 22a, 23a and 24a, and 25a and 26 of finally obtained auxiliary features are asymmetrically formed. Accordingly, the widths of patterns, which are transcribed to correspond to A1, A2 and A3 sections, are differently formed from each other as caused by the asymmetry of the auxiliary features. Particularly, when each vertical section of the feature 10 corresponds to a gate electrode pattern provided on an active area 50, a channel length of a MOSFET is locally changed.

In order to solve the above problem, the present invention provides polygonal features with respect to recessed corners of features, instead of bar-type auxiliary features.

Figure 2:
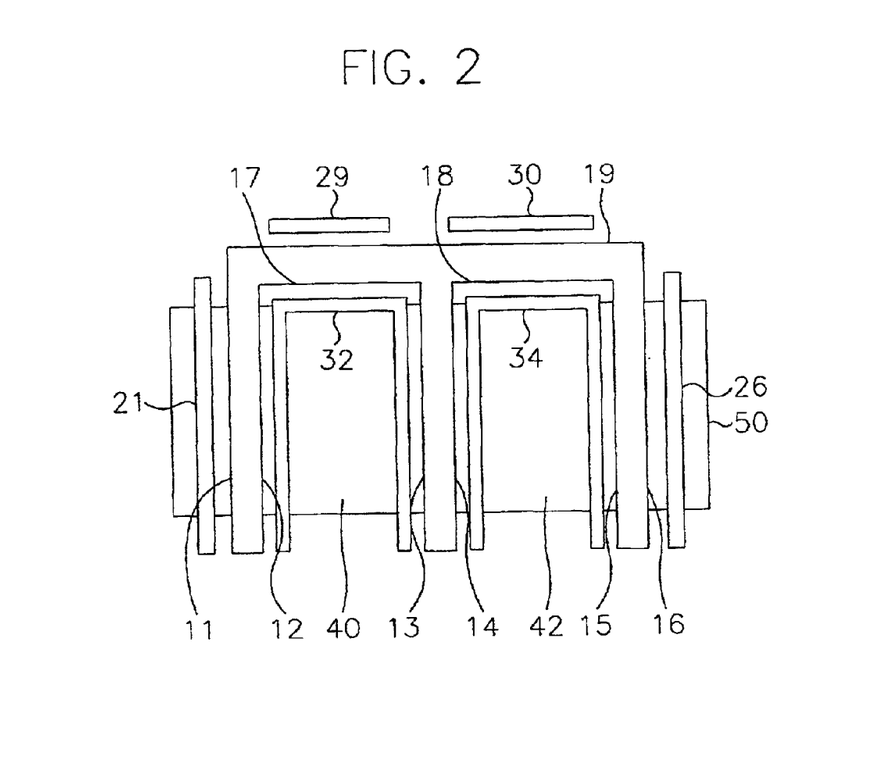
FIG. 2 is a view showing auxiliary features including polygonal auxiliary features for correcting the proximity effect according to an embodiment of the present invention.

FIG. 2 shows proximity correcting auxiliary features including polygonal auxiliary features according to an embodiment of the present invention. As illustrated in FIG. 2, bar-type auxiliary features 21, 26, 29 and 30 are included with respect to isolated edges 11, 16 and 19 of m-shaped feature 10, a polygonal auxiliary feature 32 is formed in an area 40 surrounded by isolated edges 12, 13 and 17 of the m-shaped feature 10, and a polygonal auxiliary feature 34 is formed in an area 42 surrounded by isolated edges 14, 15 and 18 of the m-shaped feature 10.

The bar-type auxiliary features 21, 26, 29 and 30 and the polygonal auxiliary features 32 and 34 increase the depth of focus of the exposure device in the same manner as the conventional auxiliary features and have widths so as not to be transcribed on a semiconductor substrate. In addition, the bar-type auxiliary features 21, 26, 29 and 30, and the polygonal auxiliary features 32 and 34, are spaced apart from the isolated edges by a predetermined distance in such a manner that the edge intensity gradients of densely packed features matches with the edge intensity gradients of isolated features.

That is, the polygonal auxiliary feature 32 is formed in a U-shape by connecting the auxiliary features 22, 23 and 27 of FIG. 1A and the polygonal auxiliary feature 34 is also formed in a U-shape by connecting the auxiliary features 24, 25, and 28 in FIG. 1A. Therefore, the number of auxiliary features according to the present invention is reduced from 10 to 6 as compared with the auxiliary features in FIG. 1A. Accordingly, the amount of data of the mask pattern can be reduced. That is, since three bar-type auxiliary features are integrated as one polygonal auxiliary feature, three bar data cords with respect to three bar-type auxiliary features can be reduced to one polygonal data cord.

When the auxiliary features are created by using the bar-type auxiliary feature design rule, lengths of bar-type auxiliary features corresponding to an isolated edge 17 are relatively shortened as compared with the lengths of bar-type auxiliary features corresponding to isolated edges 12 and 13, in the case the length of isolated edge 17 is shorter than lengths of isolated edges 12 and 13 in FIG. 2. Therefore, in order to allow bar-type auxiliary features corresponding to isolated edge 17 to be spaced apart from the adjacent bar-type auxiliary features based on the conventional auxiliary feature design rule, bar-type auxiliary features are formed to have small size, or are removed.

In addition, the lengths of the bar-type auxiliary features corresponding to the isolated edge 12 according to the conventional auxiliary feature design rule are shortened so as to maintain a space with respect to the bar-type auxiliary features corresponding to the isolated edge 17. In this case, the bar-type auxiliary features corresponding to the isolated edge 12 are asymmetrically formed with respect to the bar-type auxiliary features corresponding to the isolated edge 17. In an extreme case according to the conventional auxiliary feature design rule, since the bar-type auxiliary features are formed shortened in the active area 50, the width of the pattern is formed differently for an edge section of the active area 50 and an internal section of the active area 50. That is, a short channel is locally formed at the edge area of the active area 50, so the electrical characteristics of the transistor are lowered.

In contrast, according to the present invention, the auxiliary features corresponding to recessed corners have polygonal shapes, so that a pattern having the same width is formed in the edge section and in the internal section of the active area 50.

Figure 3:
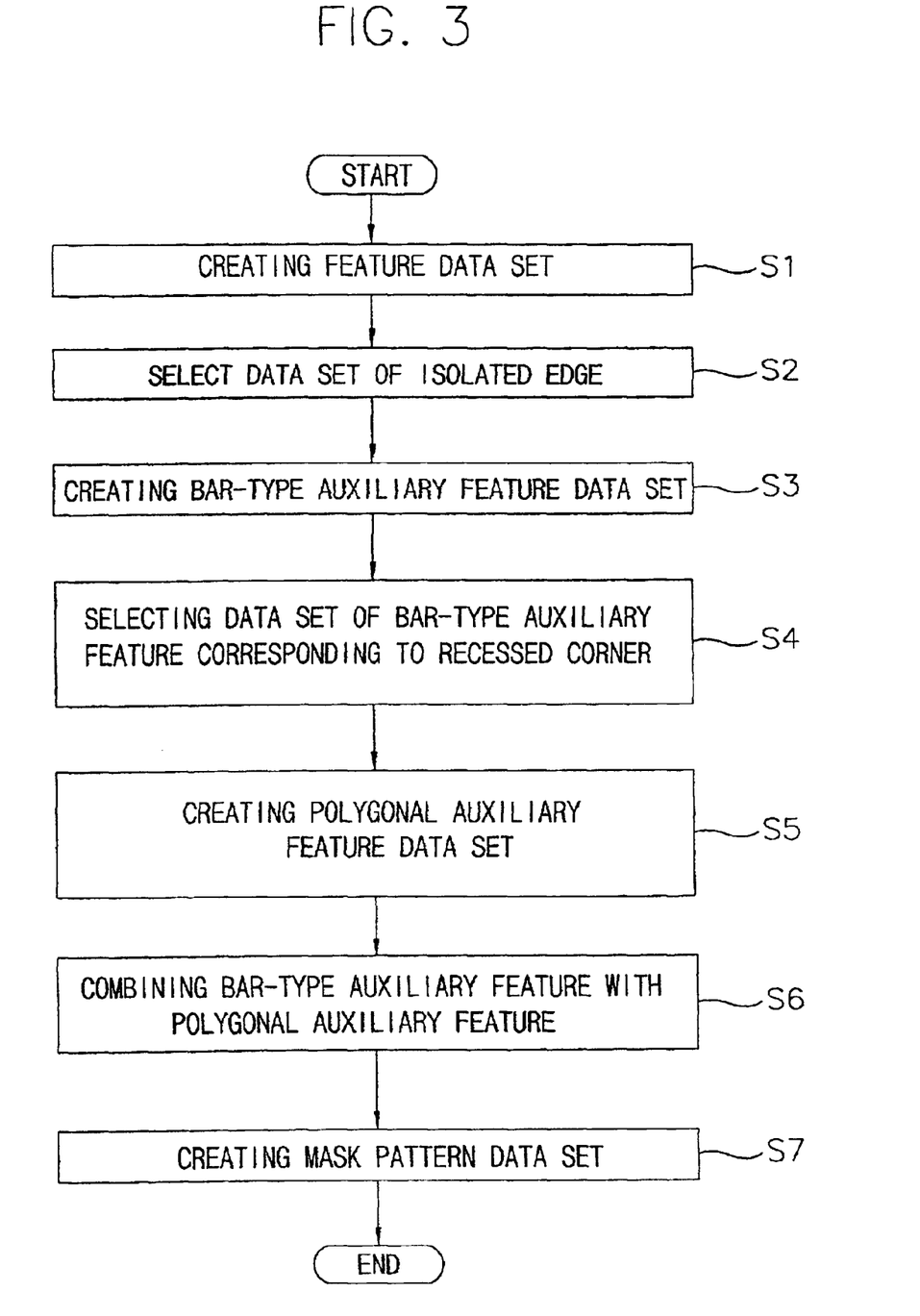
FIG. 3 is a flow chart showing a method for fabricating a mask according to an embodiment of the present invention.
Figure 4A:
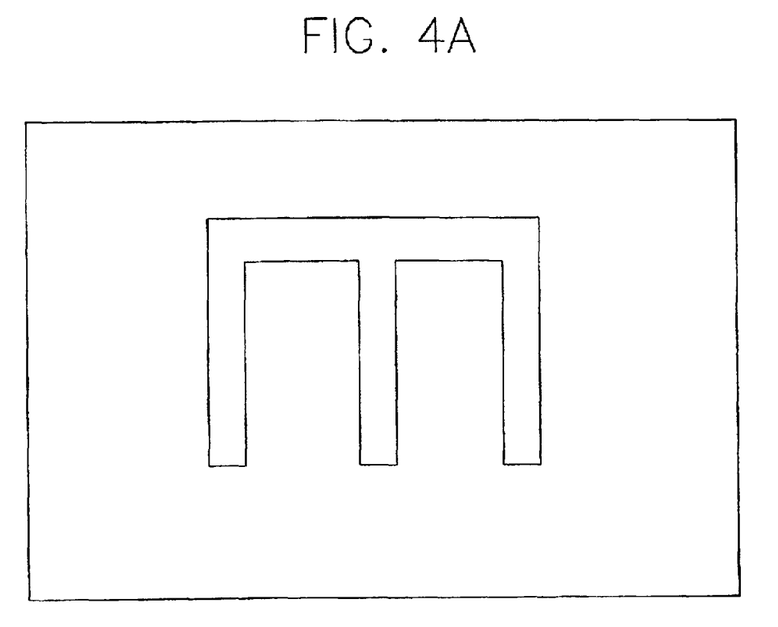
FIGS. 4A to 4G are views showing the creation of patterns corresponding to each step of the flow chart shown in FIG. 3.

FIG. 3 shows a flow chart of a method for fabricating a mask pattern so as to create the polygonal auxiliary features. Firstly, as shown in FIG. 4A, data sets of features corresponding to circuit elements for forming integrated circuits are created on the mask by using a CAD program (step S1).

Figure 4B:
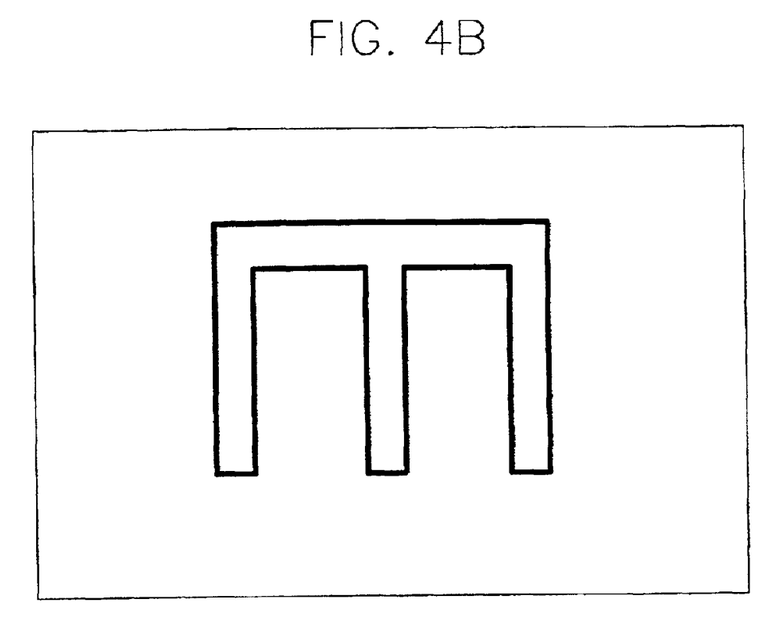

Then, first data sets of isolated edges are selected from the data sets of the features (step S2). The isolated edges are represented by a thick line as shown in FIG. 4B.

Figure 4C:
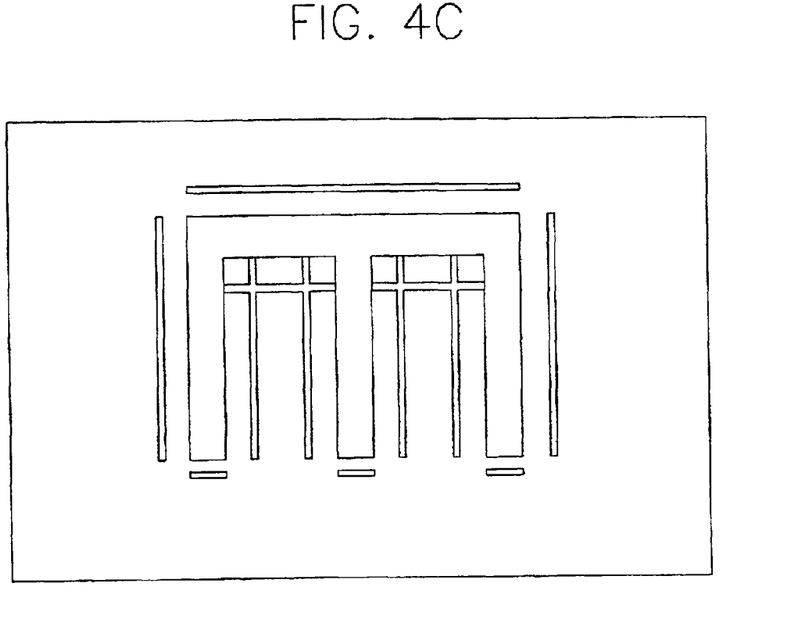

After that, as shown in FIG. 4C, second data sets of bar-type auxiliary features, which have predetermined widths and extend in parallel along the isolated edges are created as spaced apart from each isolated edge by a predetermined distance, in view of the first data sets of the selected isolated edges according to the auxiliary feature design rule (step S3). The bar-type auxiliary features corresponding to the isolated edges forming recessed corners of features are created without adopting a space distance with respect to adjacent isolated features.

Figure 4D:
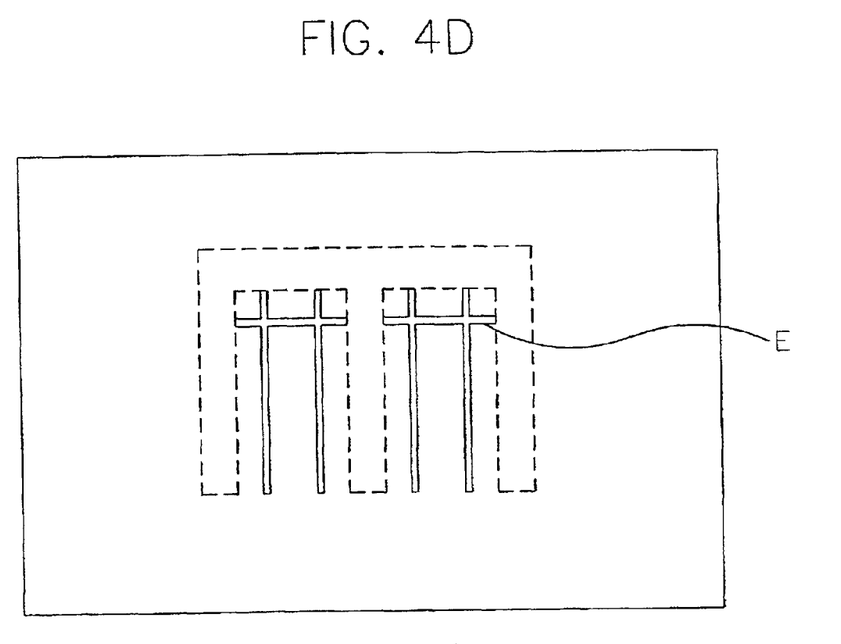

Accordingly, in order to correct the bar-type auxiliary features corresponding to the recessed corners, third data sets of the bar-type auxiliary features corresponding to the recessed corners are selected in view of the first data sets of isolated edges and the second data sets of the bar-type auxiliary features, as shown in FIG. 4D (step S4).

Figure 4E:
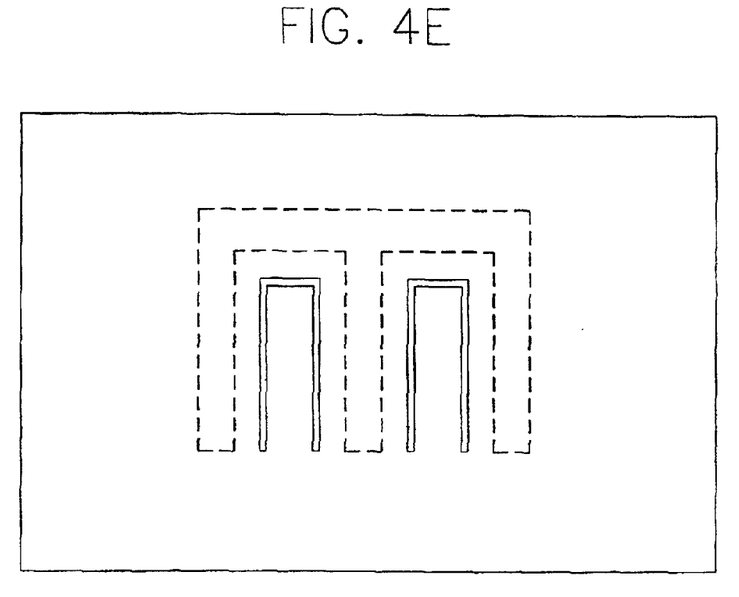

Then, as shown in FIG. 4E, fourth data sets of polygonal auxiliary features are created by removing extension parts E (in FIG. 4D) of the bar-type auxiliary features, which extend within the predetermined distance from the isolated edges, in view of the third data sets of bar-type auxiliary features corresponding to the recessed corner (step S5).

Figure 4F:
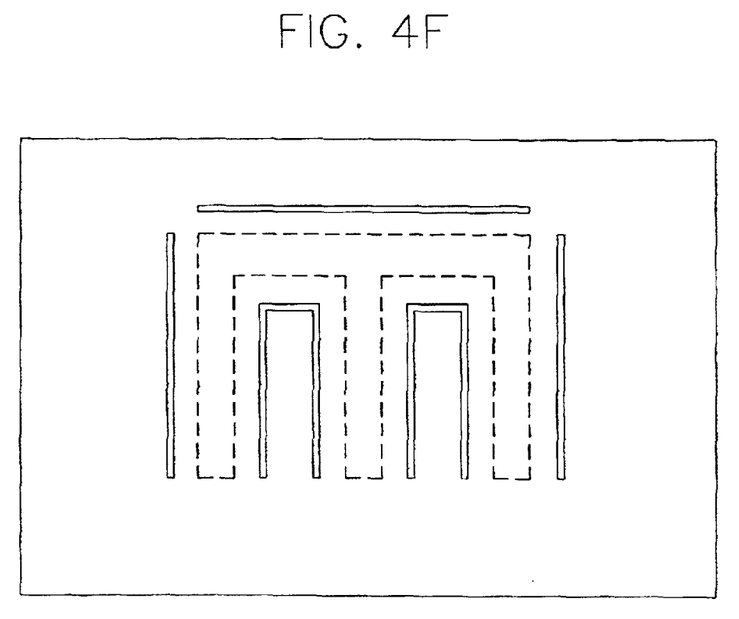

After that, as shown in FIG. 4F, final auxiliary feature data sets are created by replacing the third data sets of the bar-type auxiliary features corresponding to the recessed corners with the fourth data sets of the polygonal auxiliary features (step S6). Therefore, since the polygonal auxiliary features are formed corresponding to the recessed corners, bar-type auxiliary features, which are removed during the filtering process because the lengths thereof are shortened so as to maintain the space between adjacent auxiliary features, cannot be removed during the filtering process when auxiliary features are created for complicated patterns.

It is noted that design rule checking (DRC) is possible after creating the auxiliary features. That is, in case all auxiliary features are formed as a bar shape, an inspecting process is carried out so as to check whether or not adjacent features or auxiliary features make contact with each other or if an overlap has occurred. In general, inspecting time increases as the number of auxiliary features increases. In an extreme case, the inspecting process may be impossible. Particularly, since the structures of features are complicated as the integration degree thereof becomes high, it is difficult to uniformly create and inspect the auxiliary features in response to all circumstances. However, according to the present invention, several bar-type auxiliary features are replaced with one polygonal auxiliary feature, so that the amount of data is greatly reduced and reduced inspecting time is realized.

Figure 4G:
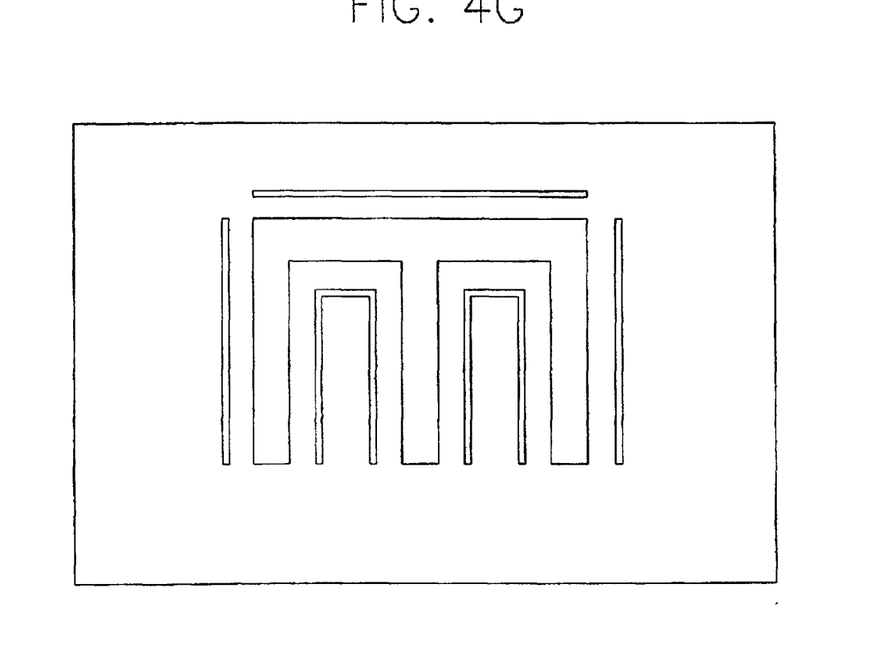

As shown in FIG. 4G, mask pattern data sets are created by combining the feature data sets and the final auxiliary feature data sets (step S7). Thereafter, the obtained mask pattern data sets are applied to an exposure device for fabricating the mask, such as an e-beam exposure device which fabricates the mask by forming a chrome pattern on a quartz substrate. Therefore, the fabricated mask has bar-type auxiliary features as well as polygonal auxiliary features corresponding to recessed corners.

Figure 5:
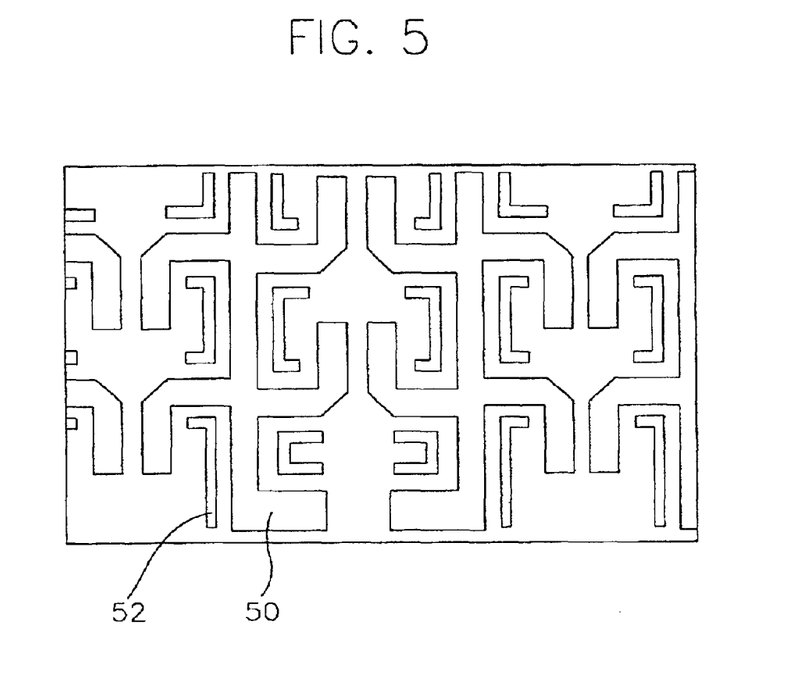
FIG. 5 is a layout view of the mask having the polygonal auxiliary features according to an embodiment of the present invention.

FIG. 5 shows a layout view of the mask including polygonal auxiliary features according to the present invention. As shown in FIG. 5, an area having a complicated pattern, such as a gate electrode pattern, is partially surrounded by features 50 and includes many recessed corners. According to the present invention, polygonal auxiliary features 52 are formed in the area instead of bar-type auxiliary features.

Figure 6:
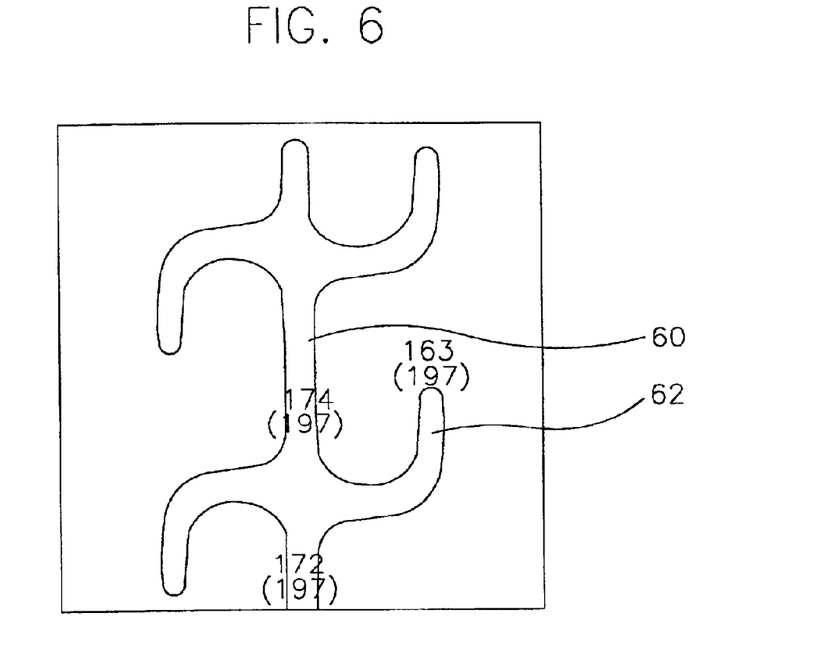
FIG. 6 is a view showing a photoresist pattern formed by using the mask shown in FIG. 5.

FIG. 6 represents a part of the pattern which is transcribed on photoresist by using the mask shown in FIG. 5. The numbers shown in the FIG. 6 are real dimensions (in nm) of the width of the pattern. The numbers in parentheses are designed dimensions (in nm) of the width of the pattern. It can be noted that the real dimensions are smaller than the designed dimensions. A stem part 60 of the pattern has a width of 174 nm or 172 nm. However, a tip portion 62 of the step part has a width of 163 nm, which is smaller than the width of the stem part 60. Compared to conventional techniques, the real dimension of the pattern width of the pattern obtained using the mask of FIG. 5 is closer to the designed dimension of the pattern width.

Figure 7:
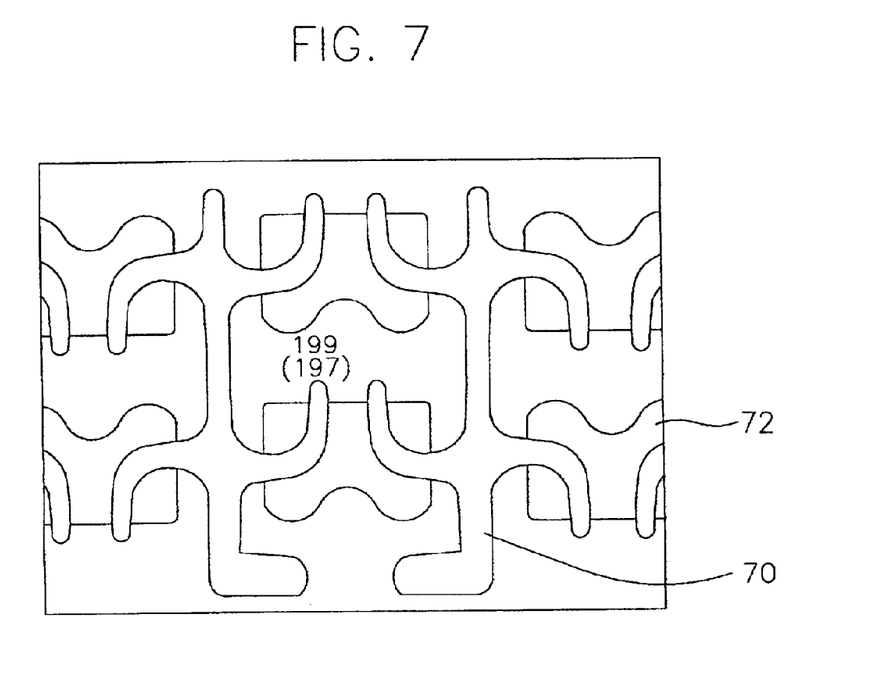
FIG. 7 is a view showing a pattern of a gate electrode layer which is etched by using the photoresist pattern shown in FIG. 6 as a mask.

FIG. 7 shows a shape of the pattern which is obtained by etching a lower material of the photoresist pattern shown in FIG. 6 by using an etching mask. In FIG. 7, reference number 70 represents the gate electrode pattern and reference number 72 represents an active area. The width of the tip portion of the step part in the etched pattern is 199 nm which is close to the designed dimension of 197 nm. In addition, the width of the gate electrode pattern forming the stem part is uniformly formed in the active area 72. That is, the width of the gate electrode at an edge of the active area is almost identical to the width of the gate electrode at an inner portion of the active area. Accordingly, the length of a channel of a MOSFET transistor is uniformly obtained at the active area 72 and the uniformity is achieved in the whole area.

Figure 8:
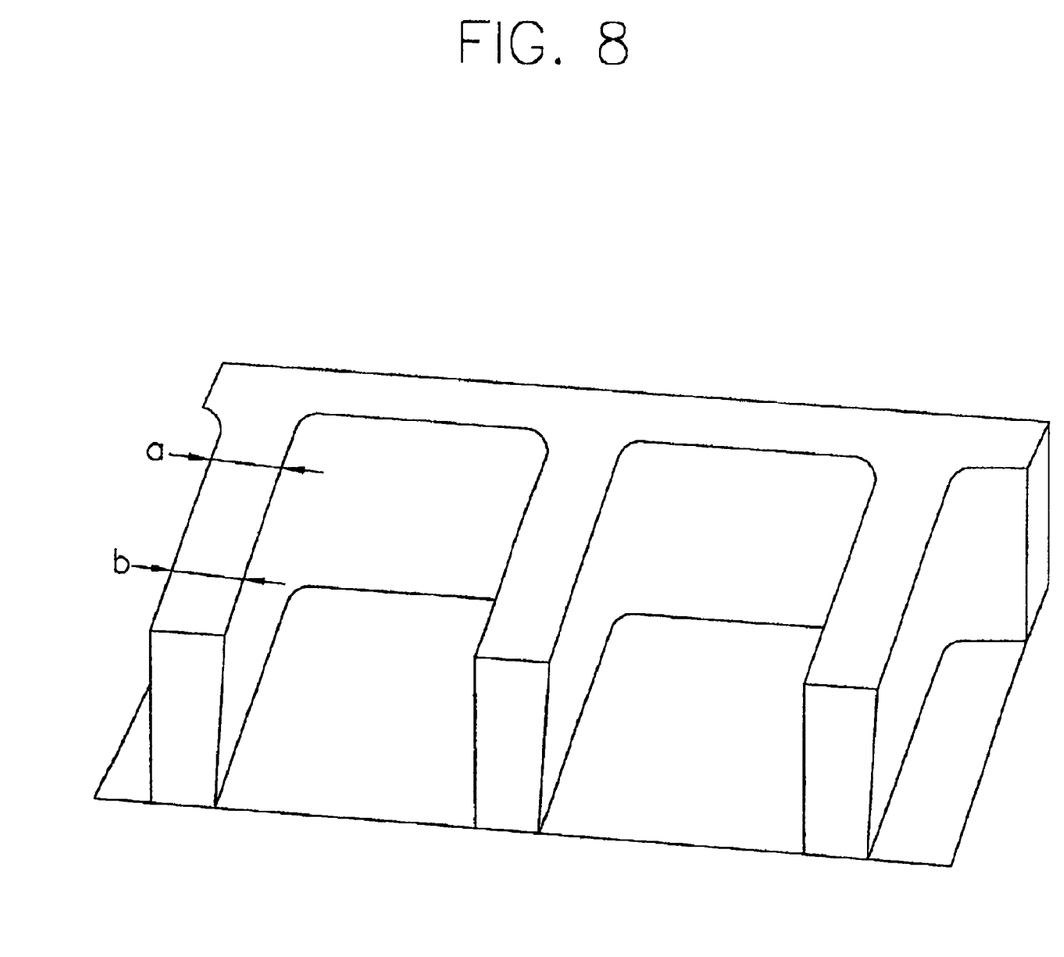
FIG. 8 is a perspective view of the gate electrode pattern achieved by using the mask having the polygonal auxiliary features according to an embodiment of the present invention.

FIG. 8 is a three-dimensional structure of the gate electrode pattern according to the present invention, wherein a pattern width (a) at the edge of the active area is substantially identical to a pattern width (b) of the inner area of the active area.

As mentioned above, the mask of the present invention has polygonal auxiliary features which are partially surrounded by features and face recessed corners of features. Accordingly, the number of auxiliary features can be greatly reduced so that the amount of data to be treated and the data treating time are greatly reduced. In addition, the memory capacitances can be reduced when treating the data.

Furthermore, the auxiliary features formed in an area surrounded by features are preserved in the form of polygonal auxiliary features based on the design rule without being removed, so the asymmetric phenomenon with respect to outer auxiliary features can be reduced. Particularly, the width of the gate electrode pattern can be uniformly maintained in the whole active area so that characteristics of the transistor can be maintained as designed.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A mask for optically transcribing a pattern corresponding to integrated circuits on a semiconductor substrate by using an exposure device, the mask comprising:
   a plurality of features corresponding to circuit elements for forming the integrated circuits, each of the plurality of features including at least one recessed corner defined by two edges; and
   a plurality of polygonal proximity correcting auxiliary features, each having a width and including two extension parts which extend in parallel along each of two edges defining a recessed corner of the plurality of features, the extension parts of a polygonal proximity correcting auxiliary feature being spaced apart from the edges defining a recessed corner by a distance and being bent at a same angle corresponding to the recessed corner, so as to be connected to each other.

2. The mask of claim 1, wherein the width of the polygonal proximity correcting auxiliary features increases a depth of focus of the exposure device, and whereby the polygonal proximity correcting auxiliary features are not transcribed onto the semiconductor substrate.

3. The mask of claim 1, wherein the distance enables edge intensity gradients of densely packed features of the plurality of features to match with edge intensity gradients of isolated features of the plurality of features.

4. The mask of claim 1, wherein the plurality of features correspond to gate electrode patterns having recessed corners.

5. A method of fabricating a mask for optically transcribing a pattern corresponding to integrated circuits onto a semiconductor substrate by using an exposure device, the method comprising:

fabricating a plurality of features corresponding to circuit elements for forming the integrated circuits, each of the plurality of features including at least one recessed corner defined by two edges; and fabricating a plurality of polygonal proximity correcting auxiliary features, each having a width and including two extension parts which extend in parallel along each of two edges defining a recessed corner of the plurality of features, the extension of parts of a polygonal proximity correcting auxiliary feature being spaced apart from the edges defining a recessed corner by a predetermined distance and being bent at a same angle corresponding to the recessed corner, so as to be connected to each other.

6. The method of claim 5, wherein the width of the polygonal proximity correcting auxiliary features increases a depth of focus of the exposure device, and whereby the polygonal proximity correcting auxiliary features are not transcribed onto the semiconductor substrate.

7. The method of claim 5, wherein the distance enables edge intensity gradients of densely packed features of the plurality of features to match with edge intensity gradients of isolated features of the plurality of features.

8. A method of fabricating a mask for optically transcribing a pattern corresponding to integrated circuits onto a semiconductor substrate by using an exposure device, the method comprising:

creating data sets of a plurality of features on the mask, the plurality of features corresponding to circuit elements for forming the integrated circuits and having at least one recessed corner;

selecting first data sets of isolated edges from the data sets of the plurality of features;

creating second data sets of bar-type auxiliary features in view of the selected first data sets of the isolated edges, the bar-type auxiliary features having widths, extending in parallel along the isolated edges and being spaced apart from each of the isolated edges by a distance;

creating third data sets of the bar-type auxiliary features corresponding to the at least one recessed corner in view of the first data sets of the isolated edges and the second data sets of the bar-type auxiliary features;

creating fourth data sets of polygonal auxiliary features by removing extension parts of the bar-type auxiliary features which extend within the distance from the isolated edges, in view of the third data sets of the bar-type auxiliary features corresponding to the at least one recessed corner;

creating final auxiliary feature data sets by replacing the third data sets of the bar-type auxiliary features corresponding to the at least one recessed corner among the second data sets of the bar-type auxiliary features with the fourth data sets of the polygonal auxiliary features; and creating mask pattern data sets by combining the data sets of the plurality of features and the final auxiliary feature data sets.

9. A mask for optically transcribing a pattern corresponding to integrated circuits on a semiconductor device, the mask comprising:

a plurality of features corresponding to circuit elements for forming the integrated circuits, at least one of the plurality of features including a recessed corner defined by adjoining edges; and a polygonal proximity correcting auxiliary feature formed directly adjacent to and spaced away from the recessed corner, and having a shape that conformally extends along the adjoining edges.

10. The mask of claim 9, wherein the at least one of the plurality of features includes three adjoining consecutive edges, and the polygonal proximity correcting auxiliary feature is U-shaped.

11. The mask of claim 9, wherein the pattern is optically transcribed using an exposure device, and whereby a width of the polygonal proximity correcting auxiliary feature increases a depth of focus of the exposure device.

12. The mask of claim 9, wherein the polygonal proximity correcting auxiliary feature is spaced away from the recessed corner by a distance that enables edge intensity gradients of densely packed features of the plurality of features to match with edge intensity gradients of isolated features of the plurality of features.

13. The mask of claim 9, wherein the polygonal proximity correcting auxiliary feature extends along an entirety of the adjoining edges.

* * * * *